(12) United States Patent
Blecic et al.

(10) Patent No.: US 12,401,263 B2
(45) Date of Patent: Aug. 26, 2025

(54) MODULATING DRIVE SIGNALS FOR POWER CONVERTERS

(71) Applicant: TEXAS INSTRUMENTS INCORPORATED, Dallas, TX (US)

(72) Inventors: Raul Blecic, Freising (DE); Syed Wasif Mehdi, Freising (DE); Pavol Balaz, Cupertino, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/453,776

(22) Filed: Aug. 22, 2023

(65) Prior Publication Data

US 2025/0070635 A1 Feb. 27, 2025

(51) Int. Cl.
*H02M 1/00* (2007.01)
*H03K 17/687* (2006.01)
*H03K 19/003* (2006.01)

(52) U.S. Cl.
CPC ....... *H02M 1/0029* (2021.05); *H02M 1/0025* (2021.05); *H03K 17/6871* (2013.01); *H03K 19/00361* (2013.01); *H03K 2217/0063* (2013.01); *H03K 2217/0072* (2013.01)

(58) Field of Classification Search
CPC .............. H02M 1/0029; H02M 1/0025; H03K 17/6871; H03K 19/00361; H03K 2217/0063; H03K 2217/0072
See application file for complete search history.

(56) References Cited

U.S. PATENT DOCUMENTS

| | | | |
|---|---|---|---|
| 10,992,294 B2* | 4/2021 | Yamato | H03K 17/164 |
| 2021/0281167 A1 | 9/2021 | Balaz | |
| 2022/0255424 A1* | 8/2022 | Fan | H03K 17/166 |

* cited by examiner

*Primary Examiner* — Metasebia T Retebo
(74) *Attorney, Agent, or Firm* — Charles F. Koch; Frank D. Cimino (57) ABSTRACT

A circuit includes a high-side driver having a high-side slew control input, a high-side drive input and a high-side drive output. A low-side driver has a low-side slew control input, a low-side drive input and a low-side drive output. Drive control circuitry has a high-side drive control output, a low-side drive control output, and a slew control output. The high-side drive control output is coupled to the high-side drive input, the low-side drive control output is coupled to the low-side drive input. The slew control output is coupled to at least one of the high-side slew control input and the low-side slew control input, and the drive control circuitry is configured to provide a slew control signal at the slew control output. The high-side and/or low-side driver is configured to modulate a slew rate of a drive signal at a respective drive output thereof based on the slew control signal.

22 Claims, 6 Drawing Sheets

MODULATING DRIVE SIGNALS FOR POWER CONVERTERS

TECHNICAL FIELD

This description relates to modulating drive signals for power converters.

BACKGROUND

Power converters are used in variety of applications to supply electrical power. As an example, switching converter include an arrangement of switches, such as power transistors, configured to convert electrical power from one form to another and provide a regulated voltage at an output terminal. The switching converter is typically designed to maintain the regulated output voltage over a range of operating conditions, including at startup and under a range of load conditions. Trends have been to use larger area transistors in switching converters to reduce resistance of transistors and enable faster switching frequencies. To reduce switching losses and maintain adequate efficiency at high switching frequencies, drivers can be configured to provide large di/dt and dv/dt. However, the large di/dt and dv/dt can result in increased electromagnetic interference (EMI).

SUMMARY

One described example circuit includes a high-side driver, a low-side driver, and drive control circuitry. The high-side driver has a high-side slew control input, a high-side drive input and a high-side drive output. The low-side driver having a low-side slew control input, a low-side drive input and a low-side drive output. The drive control circuitry has a high-side drive control output, a low-side drive control output, and a slew control output. The high-side drive control output is coupled to the high-side drive input, the low-side drive control output is coupled to the low-side drive input. The slew control output is coupled to at least one of the high-side slew control input and the low-side slew control input, and the drive control circuitry is configured to provide a slew control signal at the slew control output. At least one of the high-side and low-side drivers is configured to modulate a slew rate of a drive signal at a respective drive output thereof based on the slew control signal.

Another example circuit includes a high-side driver configured to provide a high-side drive signal based on a high-side logic signal, in which the high-side drive signal has a slew rate that is modulated based on a high-side slew control signal. The circuit also includes drive control circuitry configured to provide the high-side logic signal, and slew control logic configured to provide the high-side slew control signal.

Another described example relates to a system that includes a bridge circuit, high-side and low-side drivers, and drive control circuitry. The bridge circuit includes a high-side transistor having a first current terminal, a second current terminal, and a high-side control terminal, in which the first current terminal is coupled to an input voltage terminal. The bridge circuit also includes a low-side transistor having a third current terminal, a fourth current terminal, and a low-side control terminal, in which the third current terminal is coupled to the second current terminal, and the fourth current terminal is coupled to a ground terminal. The high-side driver has a high-side slew control input, a high-side drive input and a high-side drive output, in which the high-side drive output is coupled to the high-side control terminal. The low-side driver has a low-side slew control input, a low-side drive input and a low-side drive output, in which the low-side drive output is coupled to the low-side control terminal. The drive control circuitry has a high-side drive control output, a low-side drive control output, a low-side slew control output, and a high-side slew control output. The high-side drive control output is coupled to the high-side drive input, the low-side drive control output is coupled to the low-side drive input, the low-side slew control output is coupled to the low-side slew control input, and the high-side slew control output is coupled to the high-side slew control input. At least one of the high-side and low-side drivers is configured to modulate a slew rate of a drive signal at a respective drive output thereof based on a slew control signal.

DETAILED DESCRIPTION

This description relates to systems and circuits configured to modulate drive signals for switching power converters, such as for reducing electromagnetic interference (EMI).

As an example, a circuit includes a high-side driver, a low-side driver, and drive control circuitry. The drive control circuitry configured to provide high-side and low-side logic signals for controlling the high-side and low-side drivers. The high-side driver is configured to provide a high-side drive signal based on the high-side logic signal, and the low-side driver is configured to provide a low-side drive signal based on the low-side logic signal. The circuit can also include slew control logic, which can be part of the drive control circuitry or separate therefrom. In an example, the slew control logic is configured to provide a high-side slew control signal, and high-side drive signal has a slew rate that is modulated based on a high-side slew control signal. As used herein, the slew rate of a respective drive signal can refer to a rise time, fall time or both rise and fall times of the respective drive signal. In some examples, the high-side driver is configured to modulate the slew rate of the drive signal over a number of switching cycles responsive to the high-side slew control signal. In an example, the slew control logic can provide the high-side slew control signal to cause the high-side driver to change the slew rate through a sequence of different slew rates (e.g., a different slew rate for each of the respective switching cycle). In other examples, the slew control logic rate can be configured to randomly determine the slew rate for each of the switching cycles. The low-side driver can also be configured to modulate a slew rate of the low-side drive signal responsive to a low-side slew control signal provided by the slew control logic.

By actively changing the slew rate of the drive signals during the operation of the circuit, the strength of the gate driver is modified from one switching cycle to another switching cycles in a controlled way that creates switching waveforms with different rise and fall times. By modulating the slew rate of drive signals, the drive signals exhibit an average slew rate over time. As a result, peaks and valleys in the frequency spectrum of the power converter, which vary based on the slew rate of a voltage at the switching node and based on the slew rate of current through transistors of the output stage, can likewise be averaged out over a number of switching cycles and, thereby reduce EMI over time. The approach described herein can further reduce EMI produced in the driver circuitry, particularly at lower output currents. Additionally, such averaging of the rise and fall times over a number of switching cycles can also reduce the impact of the operating environment and board design, which can vary for different use environments and end user designs. The approach described herein thus provides, on average, lower EMI values in the frequency spectrum over a number of cycles and over a wide frequency range when compared to fixed rise and fall times.

Figure 1:
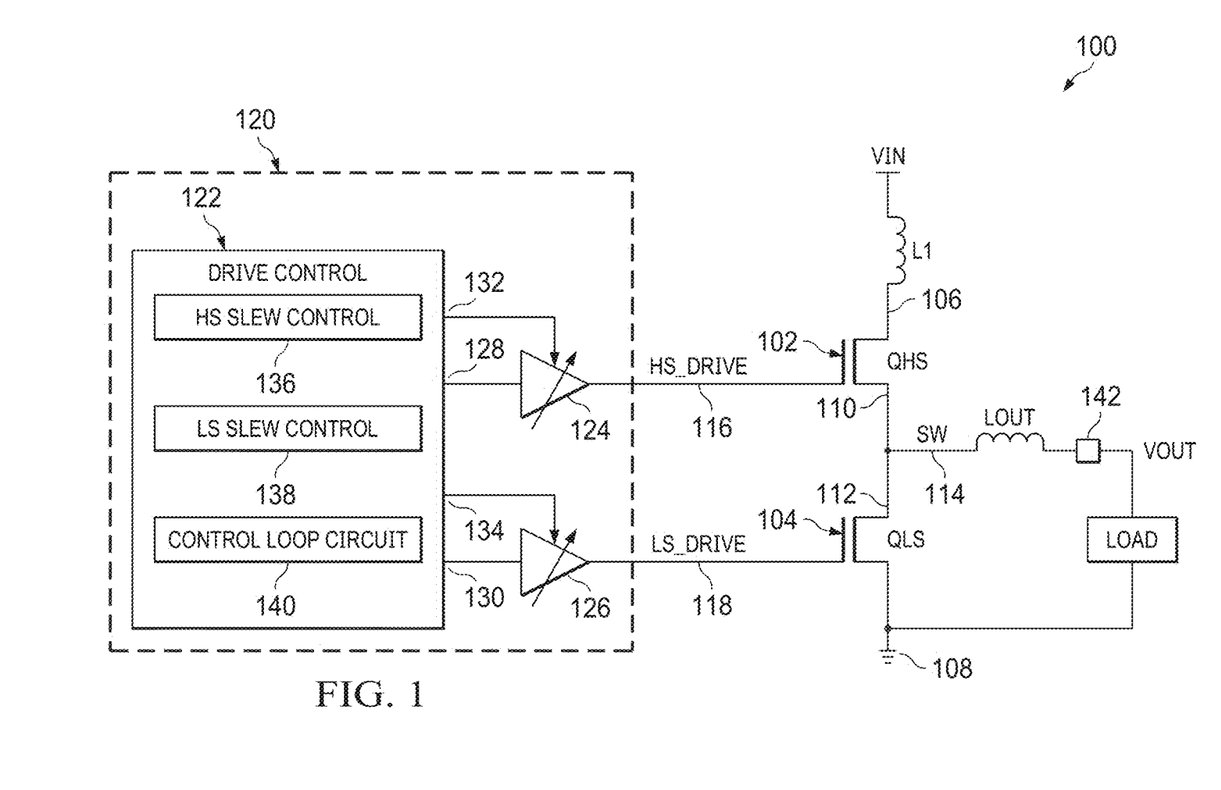
FIG. 1 is a block diagram of an example power converter circuit.

FIG. 1 is a block diagram showing an example power converter circuit 100. The power circuit 100 includes a bridge circuit, such as a half-bridge or other power stage topology, having a high-side transistor QHS and a low-side transistor QLS. In the example of FIG. 1, the high-side and low-side transistors are implemented as power field effect transistors (FETs), such as n-channel FETs (NFETs). In other examples different types of transistors may be used, such as p-channel FETs (PFETs), insulated-gate bipolar transistors (IGBTs), bipolar junction transistors (BJTs), laterally-diffused metal-oxide semiconductor (LDMOS) transistors, and the like. The transistors QHS and QLS are coupled between first and second voltage terminals, shown as an input supply terminal 106 and a ground terminal 108. The input supply terminal 106 can be coupled to an input power supply (e.g., configured to provide an input voltage VIN) through a parasitic inductance, shown as L1, and the ground terminal 108 can be coupled to a ground for the circuit 100. Respective output terminals 110 and 112 of the transistors QHS and QLS can be coupled together at a switching terminal (SW) 114 of the circuit 100. Each of the transistors QHS and QLS has a respective control input (e.g., a gate) coupled to respective drive outputs 116 and 118.

The drive circuitry 120 is configured to control the transistors QHS and QLS. The drive circuitry 120 includes drive control circuit 122, a high-side driver 124 and a low-side driver 126. To promote clarity, various components (e.g., error amplifier, pulse width modulation circuitry, filter circuitry, etc.) of the converter 100 have been omitted from the drive circuitry 120 of FIG. 1. In the example of FIG. 1, the drive control circuit 122 has a high-side drive control output 128, a low-side drive control output 130, and one or more slew control outputs, shown as a high-side slew control output 132 and low-side slew control output 134. The high-side drive control output 128 is coupled to a high-side drive input of the high-side driver 124, and the low-side drive control output 130 is coupled to a low-side drive input of the low-side driver 126. The high-side slew control output 132 is coupled to a high-side slew control input of the high-side driver 124 and the low-side slew control output 134 is coupled to the low-side slew control input of the low-side driver 126. In the example of FIG. 1, the circuit 100 includes both high-side and low-side slew control outputs coupled to the respective drivers 124 and 126. In other examples, the drive control 122 can provide a slew control output to only one of the high-side or low-side drivers 124, 126 or, alternatively, provide a common slew control signal to each of the respective drivers 124 and 126.

The drive control circuit 122 includes high-side slew control logic 136, low-side slew control logic 138 and a control loop circuit (also referred to herein as a loop circuit) 140. The high-side slew control logic 136 is configured to provide a high-side slew control signal at the output 132. The low-side slew control logic 138 is configured to provide a low-side slew control signal at the output 134. The loop circuit 140 is configured to receive feedback representative of an output voltage (VOUT) provided at an output 142 of the converter circuit 100, and determine control logic signals for controlling each of the high-side and low-side drivers 124 and 126. For example, the loop circuit includes an error amplifier configured to compare the feedback signal with a reference signal to generate the high-side and low-side logic signals at 128 and 130. The high-side driver 124 is configured to provide a high-side drive signal HS_DRIVE to the control input of the high-side transistor QHS based on the high-side logic signal. As described herein, the high-side driver 124 is also configured to provide the high-side drive signal with a slew rate that is modulated based on the high-side slew control signal provided at 132. The low-side driver can be similarly configured to provide a low-side drive signal LS_DRIVE based on the low-side logic signal provided at 130, in which the low-side drive signal has a slew rate that is modulated based on the low-side slew control signal 134.

In an example, the high-side driver 124 includes circuitry configured to modulate the high-side drive signal HS_DRIVE at 116 by changing the slew rate of the drive signal from a given slew rate during one switching cycle to another slew rate during a subsequent switching cycle based on the slew control signal at 132. The slew rate of the drive signal at 116 can be changed over a number of switching cycles during operation. In one example, the slew rate can be changed in a sequence of different slew rates from one cycle to another cycle (e.g., a sequence of two, three, four or more slew rates). In another example, the slew rate can be changed randomly (or pseudorandomly) from one switching cycle to another, such as by randomly choosing the slew rate for each cycle from a set of defined slew rates.

The low-side driver 126 can also include slew rate circuitry configured to modulate the slew rate of the low-side drive signal LS_DRIVE at 118 by changing the slew rate of the drive signal from a given slew rate during one switching cycle to another slew rate during a subsequent switching cycle based on the slew control signal at 134. The modulated slew rates used for the low-side drive signal at 118 can be the same or different than used for the high-side drive signal at 116. The drivers 124 and 126 and the drive control circuit 122 can be configured to modulate respective slew rates with rates that depend on the switching frequency of the power converter circuit 100 and the operating frequency of the device in which the power converter is implemented to provide a desired improvement in EMI. For example, at operating frequencies above 500 MHz (e.g., 700 MHz to 1 GHz or higher) a reduction of 7 dB or greater in EMI can be achieved by modulating slew rates as described herein.

Figure 2:
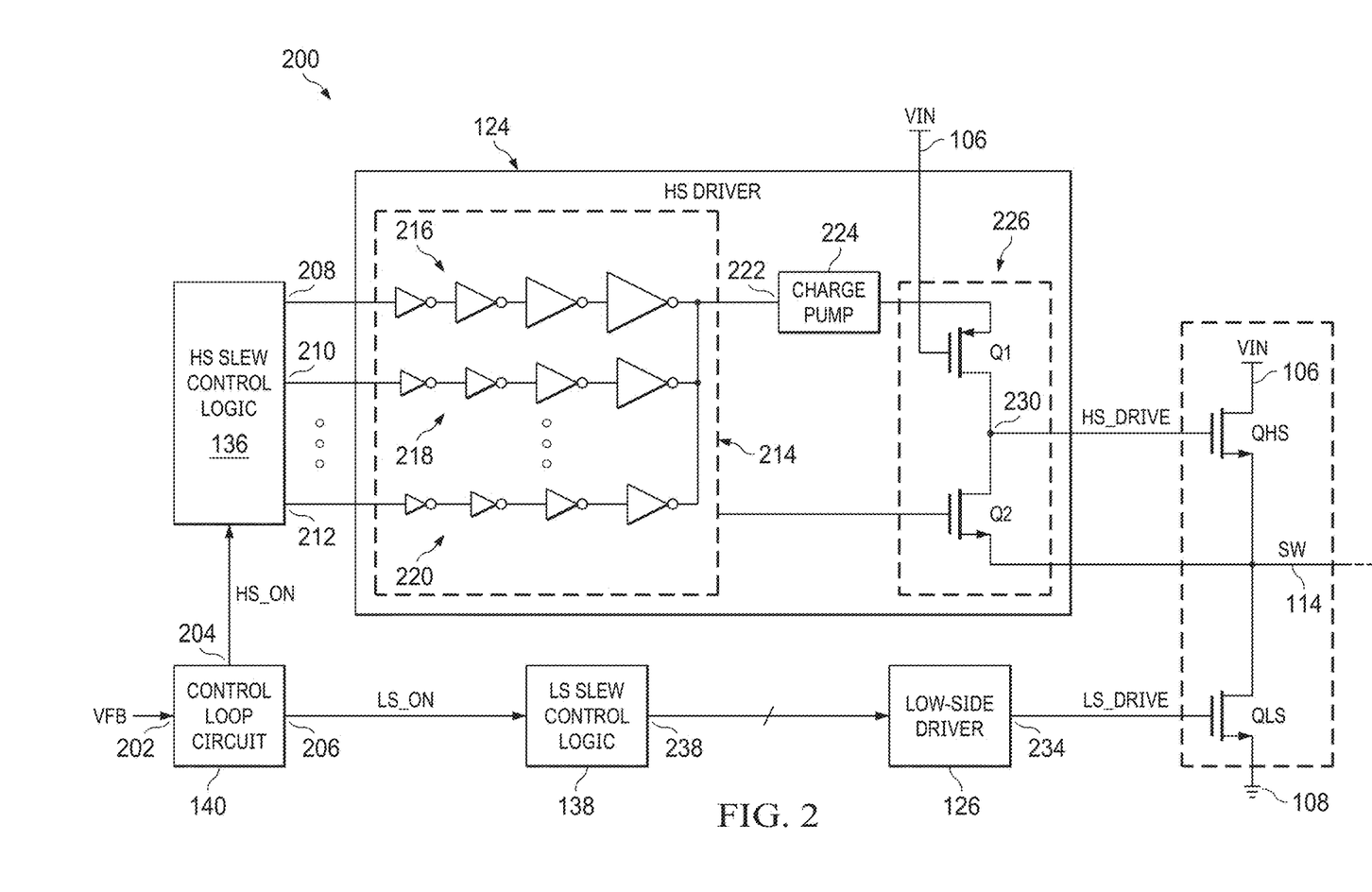
FIG. 2 is a block diagram of part of a power converter circuit showing an example high-side driver.

FIG. 2 depicts an example of another power converter circuit 200. The power converter circuit 200 provides a useful example of a circuit that can be used to implement the power converter 100 of FIG. 1. Accordingly, portions of the description of FIG. 2 also refer to FIG. 1. To promote clarity, various components (e.g., error amplifier, pulse width modulation circuitry, etc.) of the converter circuit 200 have been omitted from the drive circuitry 120 of FIG. 2. The circuit 200 includes a control loop circuit 140 having a loop input 202 and logic outputs 204 and 206. The loop circuit 140 includes circuitry configured to provide drive logic signal HS_ON and LS_ON at outputs 204 and 206, respectively, based on a feedback signal, shown as a feedback voltage VFB, received at the loop input 202. The HS_ON and LS_ON signals constitute enable signals to enable the high-side and low-side drivers, respectively. The converter circuit 200 also includes high-side slew control logic 136 and low-side slew control logic 138. The high-side slew control logic 136, low-side slew control logic 138, and control loop circuit 140 can form drive control circuitry (e.g., the drive control circuit 122 of FIG. 1). The high-side slew control logic 136 has an input coupled to the logic output 204 and one or more outputs coupled to respective inputs of a high-side driver 124. The low-side slew control logic 138 has an input coupled to the logic output 206 and one or more outputs coupled to respective inputs of a high-side driver 124. In some examples, a single integrated slew control logic can be used regardless of whether one or both of the high-side and low-side drivers are configured to modulate the slew rates of respective drive signals.

As shown in FIG. 2, the high-side slew control logic 136 includes a plurality of high-side slew control outputs 208, 210 and 212. The high-side driver 124 includes an inverter circuit 214 having a plurality of (e.g., two or more) drive paths 216, 218 and 220, in which each drive path has an input coupled to a respective slew control output. In the example of FIG. 2, the inverter circuit 214 includes three drive paths 216, 218 and 220. In other examples, the inverter circuit 214 can include any number of two or more such drive paths.

In the example of FIG. 2, each drive path includes an arrangement of inverters coupled in series between a respective slew control output 208, 210 and 212 and an input 222 of a charge pump input 222. For example, each drive path 216, 218 and 220 has a path input and a path output, in which each path input is coupled to a respective high-side slew control output 208, 210 and 212. Each path output is coupled to the filter input 222, which can be coupled to a high-side drive output 230 through a charge pump 224 and a push-pull amplifier circuit 226. Each drive path 216, 218 and 220 thus is configured, (e.g., having differently sized inverters) to have a different drive strength for the respective drive path. For example, the path 216 includes larger inverters than each of the other inverter paths 218 and 220, and the inverter path 218 has larger inverters than path 220. In some examples, the inverters in each path can also increase in size and thus strength in sequential order of such inverters from the input to the output of each path 216 (e.g., each inverter of a respective inverter path is larger than a preceding inverter). Larger inverters can be implemented by forming each transistor thereof to have a relatively larger area, which affords increased current driving capabilities compared to configuring inverters with transistors having a relatively smaller area. A larger current driving capability, which is a result of using larger area transistors, results in the increased drive strength. The different drive strengths enable each path 216, 218 and 220 to provide a respective drive signal having a different slew rate. Therefore, the high-side slew logic 136 is configured to provide a logic signal to activate a respective one of the drive paths, and the high-side driver is configured to provide a high-side drive signal having slew rate (e.g., rise time and/or fall time) that depends on the drive strength of the activated drive path.

In an example, the high-side slew logic 136 is configured to activate one of the drive paths 216, 218 and 220 in one switching cycle and then another drive path in a subsequent switching cycle, which can be consecutive cycles or spread across different intervals within the sequence. The switching cycle can be set according to a clock signal (not shown) used by the drive control circuitry to provide the HS_ON and LS_ON signals. The high-side slew logic 136 can activate the drive paths, one per switching cycle, according to a sequence (e.g., 216→218→220 or 220→218→216 or another sequence), which can be repeated or changed over a number of switching cycles. For example, the high-side slew control logic 136 includes a counter and a multiplexer, in which the counter has a counter output coupled to a control input of the multiplexer and the multiplexer outputs are coupled to respective path inputs. The multiplexer can be configured to supply the HS_ON signal at 204 to a respective multiplexer output and drive a respective drive path based on the counter value. Other types of circuitry can be used in other examples to implement the high-side slew control logic 136 to control which one of the drive paths 216, 218 or 220 is operative to provide the high-side drive signal and having a respective slew rate for a respective switching cycle.

The charge pump 224 is configured provide sufficient voltage to turn on the push-pull amplifier 226 to turn on the high-side transistor QHS. For example, the push-pull amplifier 226 includes transistors Q1 and Q2 coupled between an input supply terminal 106 and a switching terminal 114. For example, Q1 has a control input (e.g., gate) coupled to the input supply terminal 106, a first current terminal (e.g., source) coupled to the output of the charge pump 224, and a second current terminal is coupled to a drive output 230. The drive output 230 is coupled to a control input (e.g., gate) of the high-side transistor QHS. Q2 has a control input (e.g., gate) coupled to an output of the inverter circuit 214. For example, the inverter circuit 214 can be configured to provide a slew rate adjusted control signal at the control input of Q2 from the selected inverter path (e.g., in drive path that is used to activate Q2) to turn on Q2 out of phase with Q1. The transistor Q2 also has a first current input (e.g., drain) coupled to the drain of the transistor Q1 and a second current input (e.g., source) coupled to the switching terminal 114. The high-side transistor QHS has a first current terminal (e.g., source) coupled to an input supply terminal 106, and a second current terminal (e.g., drain) coupled to the switching terminal 114. The high-side driver 124 is configured to provide the drive signal HS_DRIVE at the drive output 230, and the high-side transistor QHS is activated to couple the switching terminal 114 to the input voltage VIN for supplying power through the switching terminal to the converter output (e.g., output 142 of FIG. 1).

The low-side driver 126 has an output 234 coupled to a control input (e.g., gate) of a low-side transistor QLS. The low-side transistor QLS has a first current terminal (e.g., drain) coupled to the switching terminal 114 and a second current terminal (e.g., source) coupled to a ground terminal 108. The circuit 200 also includes low-side slew control logic 138 having an input coupled to the output 206 and one or more slew control outputs 238 coupled to one or more respective inputs of the low-side driver 126. Additionally, while examples of the high-side driver 124 have been provided for controlling turn on the high-side transistor QHS, to promote clarity details of the low-side driver have been omitted from FIG. 2. The low side driver 126 can include similar circuitry, as described with respect to the high-side driver 124, configured to provide a drive signal LS_DRIVE to control the low-side switching transistor QLS. For example, the low-side driver 126 can include a number of drive paths, in which each drive path has a different respective drive strength, such as described herein.

The slew control logic 138 is configured to control which of the drive paths is operative to provide the drive signal LS_DRIVE to the low-side transistor QLS for the respective switching cycles. The low-side driver 126 thus is configured to provide the drive signal LS_DRIVE at the output 234 based on LS_ON logic signal. The converter circuit 200 further is configured to provide a regulated switching voltage at the switching terminal 114 as well as a resulting output voltage at an output (not shown) based on the logic signal HS_ON and LS_ON. Each of the switching voltage at 114 and the converter output voltage exhibits reduced EMI due to the modulated gate drive signals HS_DRIVE and LS_DRIVE, as described herein.

Figure 3:
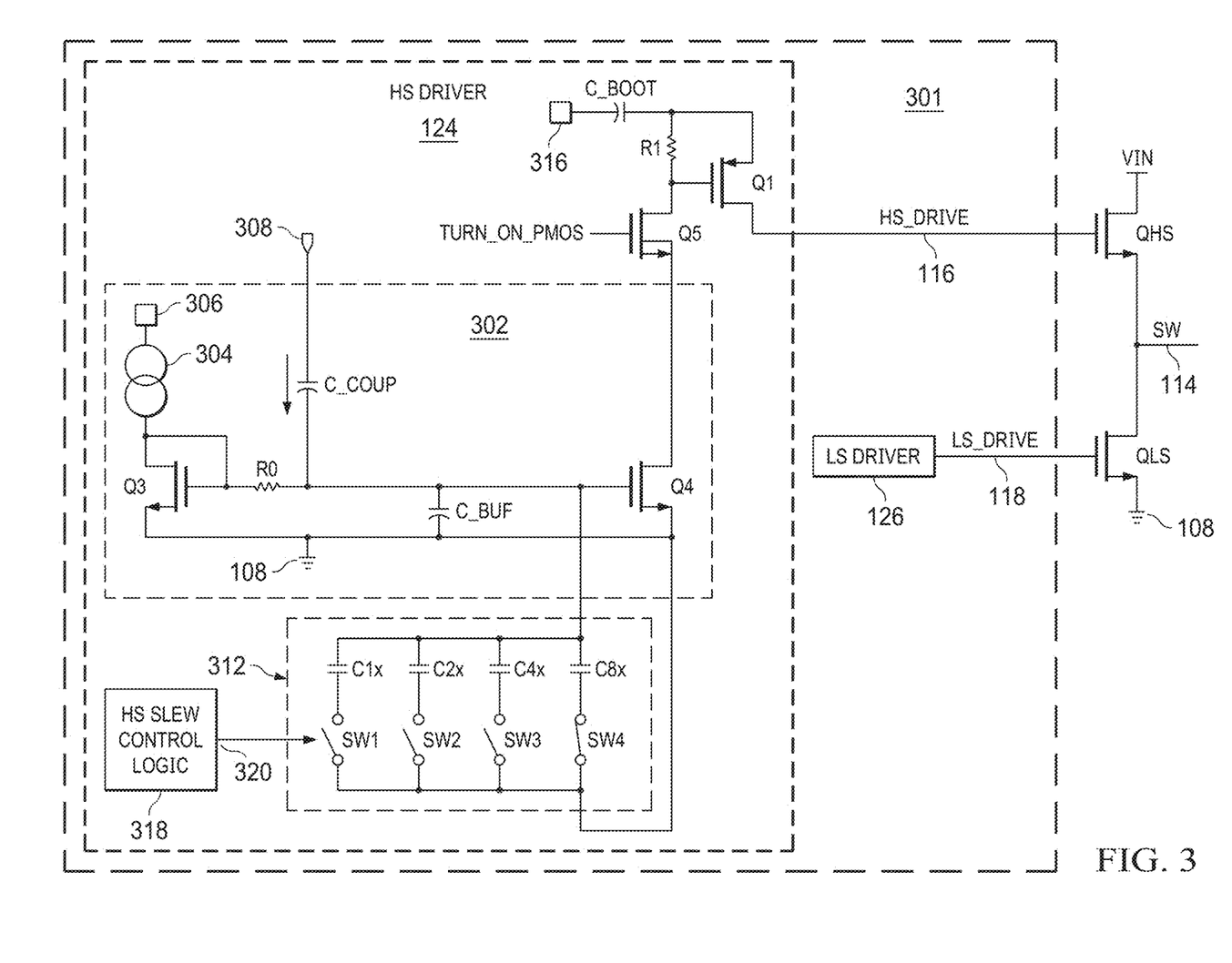
FIG. 3 is a circuit diagram of part of a power converter circuit showing another example high-side driver.

FIG. 3 depicts an example of another power converter circuit 300, which can be used to implement the converter circuit 100 of FIG. 1. Accordingly, the description of FIG. 3 also refers to FIG. 1 where appropriate. The circuit 300 includes drive circuitry 301 that includes high-side and low-side drivers 124 and 126 having respective drive outputs 116 and 118 coupled to control inputs of a bridge circuit. The bridge circuit includes a high-side transistor QHS and a low-side transistor QLS. The high-side driver 124 is configured to provide a high-side drive signal at 116 to drive QHS and the low-side driver 126 is configured to provide a low-side drive signal at 118 to drive QLS. As described herein, one or both drivers 124 and 126 of the circuit 300 is configured to modulate the slew rate of one or more drive signals to reduce EMI during operation of the circuit. To promote clarity, various components (e.g., drive logic, error amplifier, pulse width modulation circuitry, etc.) of the converter circuit 300 have been omitted from the drive circuitry 301 of FIG. 3.

In the example of FIG. 3, the high-side driver 124 includes a loop circuit 302 in the control path for controlling the high-side drive signal HS_DRIVE used to control activation (e.g., turn on and turn off) of the high-side transistor QHS. The loop circuit 302 includes a diode-connected transistor Q3 coupled between a current source 304 and a ground terminal 108. The current source 304 is coupled to an input terminal 306 and is configured to supply a first input current at a first input of the loop circuit 302. A resistor R0 is coupled between the control input of the transistor Q3 and a control input of another transistor Q4. A coupling capacitor C_COUP is coupled between a second current input terminal 308 and a control input of a transistor Q4. A buffer capacitor C_BUF is coupled between the control input of the transistor Q4 and the ground terminal 108. The transistor Q4 has a first current terminal (e.g., source) coupled to the ground terminal 108 and a second current terminal (e.g., drain) is coupled to a first current terminal (e.g., source of another transistor Q5. In an example, Q4 and Q5 are NMOS transistors. The transistor Q5 includes a control input (e.g., gate) coupled to an output of a control circuit (e.g., control loop circuit 140) and a second current input (e.g., drain) coupled to boot terminal 316 through a resistor R1 and a boot capacitor C_BOOT. The high-side driver 124 also includes an output transistor Q1. The transistor Q1 has a control input (e.g., gate) coupled to the second current input (e.g., drain) of the transistor Q5. The transistor Q1 also has a first current input (e.g., drain) coupled to the drive output 116 and a second current input (e.g., source) coupled to a node terminal between the resistor R1 and the capacitor C_BOOT. The transistor Q1 thus is configured to provide the high-side drive signal (HS_DRIVE) at the drive output 116 to turn on QHS.

The high-side driver 124 also includes a capacitor network 312 coupled in parallel with C_BUF between the control input of the transistor Q4 and the ground terminal 108. The capacitor network 312 is configured to provide a variable capacitance across the capacitor C_BUF between the control input of the transistor Q4 and the ground terminal 108 based on a slew control signal provided by slew control logic 318. In the example of FIG. 3, the capacitor network 312 includes capacitors C1, C2, C3, and C4, each coupled in series with a respective switch SW1, SW2, SW3, and SW4 between the control input of Q4 and the ground terminal 108. In an example, the capacitors C1, C2, C3, and C4 in the network 312 are binary weighted capacitors (e.g., having relative capacitances of 1×, 2×, 4×, and 8×). While C_BUF is shown separate from the network 312, C_BUF can also be implemented as part of the network. Additionally, there can be any number of capacitors in the network 312, which can be switched into and out of the circuit. The transistor Q1 is configured to provide the high-side drive signal HS_DRIVE based on operation of the loop circuit and, as described herein, the high-side drive signal HS_DRIVE has a slew rate that is modulated.

As a further example, the slew control logic 318 has outputs 320 coupled to control inputs of the switches SW1, SW2, SW3, and SW4. The slew control logic 318 can be implemented by circuitry configured to control which one or more of the switches SW1, SW2, SW3, and/or SW4 is activated (e.g., turned on) to couple one or more respective capacitors C1, C2, C3, C4 into the circuit to provide a corresponding capacitance between the control input of the transistor Q4 and the ground terminal 108. The capacitance between the control input of the transistor Q4 and the ground terminal 108 is configured to control the rate of activation of the transistor Q4, which further controls Q1 and the rise time and fall time (e.g., slew rate) of the high-side drive signal HS_DRIVE.

As described herein, the slew control logic 318 is configured to actively change the slew rate (e.g., the rise and/or fall times) of the high-side drive signal HS_DRIVE over a number of switching cycles (e.g., from one cycle to another). For example, the slew control logic 318 can provide the high-side slew control signals to change the time constant of the loop circuit 302, which causes the slew rate of drive signal HS_DRIVE to change through a sequence of different slew rates (e.g., a different slew rate for each of the respective switching cycle). In other examples, the slew control logic rate 318 can be configured to randomly change the slew rate from one switching cycle to another. By actively changing the slew rate (e.g., the rise and/or fall times) of the high-side drive signal HS_DRIVE, the EMI of the circuit 300 can be reduced during operation. In the example of FIG. 3, a pull down path at the control input of the high-side transistor QHS (e.g., transistor Q2 coupled between drive output 116 and switching terminal 114) has been omitted for sake of simplicity. Such pull down path transistor Q2 can be configured to turn off the QHS based on a control signal, which is out of phase with the signal at the control input of Q1 and which can also implement a modulated slew rate for controlling pull down, such as described herein.

The circuit 300 also includes a low-side driver 126 having a drive output 118 coupled to a control input (e.g., gate) of a low-side transistor QLS. The low-side transistor QLS is coupled between the switching output SW and the ground terminal 108. The low-side driver 126 is configured to provide a low-side drive signal LS_DRIVE at 118 to drive QLS. In some examples, the low-side driver 126 can also include slew control logic and slew rate adjusting circuitry (e.g., a variable capacitor network) configured to modulate a slew rate of the low-side drive signal LS_DRIVE provided at 118. The slew control logic and circuitry of the low-side driver 126 can be implemented in the same or different approach, as described herein with respect to the high-side driver 124 of FIG. 2. In other examples, the low-side driver can be implemented without being configured to modulate the slew rate of the low-side drive signal at 118.

Figure 4:
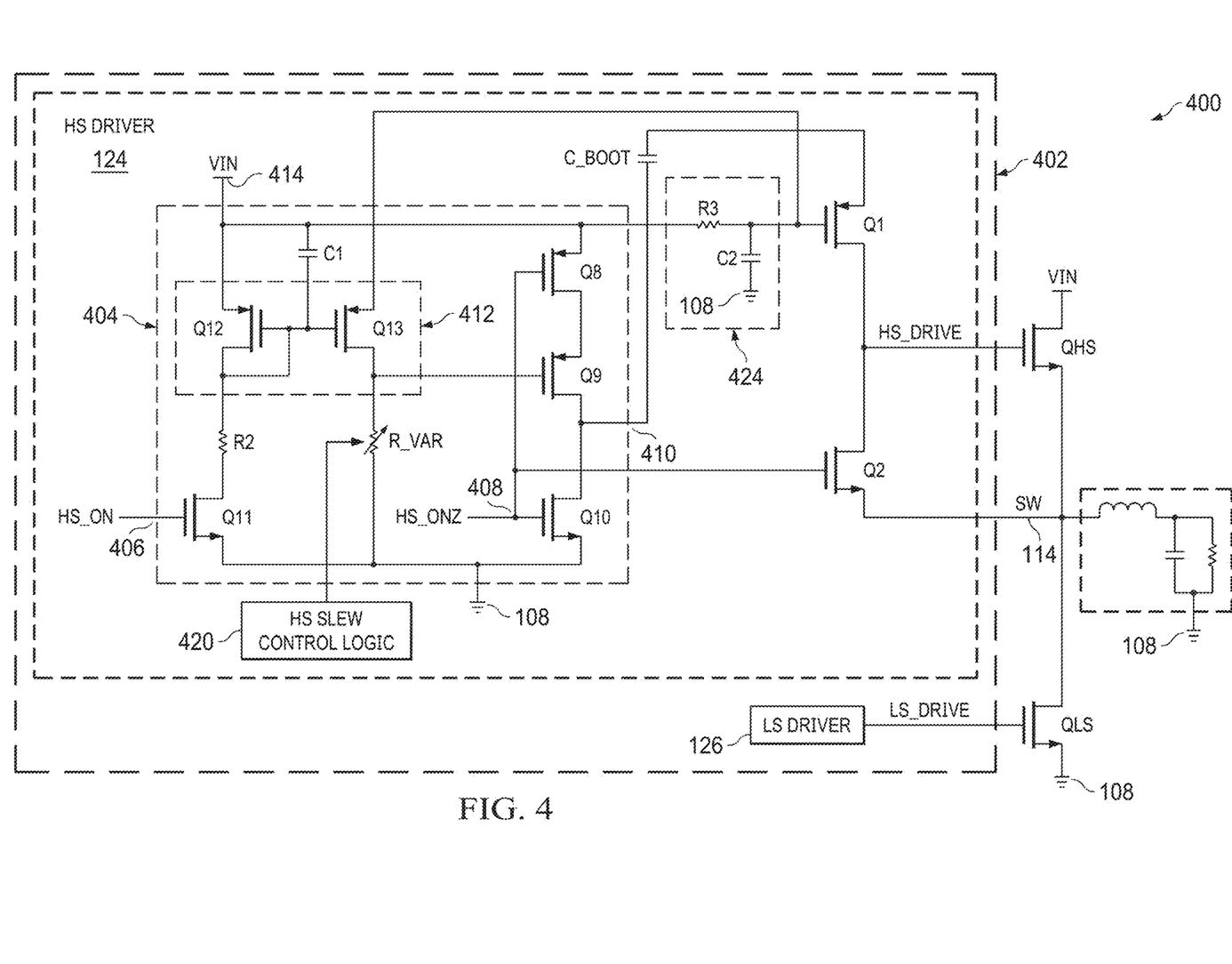
FIG. 4 is a circuit diagram of part of a power converter circuit showing another example high-side driver.

FIG. 4 depicts another example of a power converter circuit 400. The power converter circuit 400 is another example of a power converter that can be used to implement the converter circuit 100 of FIG. 1. Accordingly, the description of FIG. 4 also refers to FIG. 1. To promote clarity, the converter circuit 400 may also be identical to the converter circuits of FIG. 2, except for use of an alternative example of a drive circuit 402 (in place of the drive circuits of FIGS. 2 and 3). Similar to FIGS. 1, 2 and 3, the drive circuit 402 includes high-side and low-side drivers 124 and 126. The high-side and low-side drivers 124 and 126 have respective drive outputs 116 and 118 coupled to control inputs of a bridge (e.g., a half-bridge or full-bridge) circuit. The bridge circuit includes a high-side transistor QHS, and a low-side transistor QLS. The high-side driver 124 is configured to provide a high-side drive signal at 116 to drive QHS and the low-side driver 126 is configured to provide a low-side drive signal at 118 to drive QLS. As described herein, one or both drivers 124 and 126 of the circuit 400 is configured to modulate the slew rate of one or more drive signals to reduce EMI during operation of the circuit.

In the example of FIG. 4, the high-side driver 124 includes an inverter circuit 404, a filter 424 and a push-pull amplifier, which includes transistors Q1 and Q2. A first current terminal (e.g., source) of the transistor Q1 is coupled to a first (e.g., top) terminal of a boot capacitor C_BOOT, and a second terminal (e.g., drain) of the transistor Q1 is coupled to the control terminal of the high-side transistor QHS. A first terminal (e.g., source) of the transistor Q2 is coupled to the first terminal of the high-side transistor QHS, which is couple to the switching terminal SW. A second terminal (e.g., drain) of the transistor Q2 is coupled to the second terminal of the transistor Q1, which is also coupled to the gate of the transistor QHS. A control terminal of the transistor Q2 is coupled to the inverter circuit 404.

The inverter circuit 404 has inputs 406 and 408 and an output 410. The input 406 is coupled to an output of a control loop circuit (e.g., circuit 140) to receive a high-side ON (HS_ON) signal and the input 408 is coupled to another output of the control loop circuit to receive an inverted version of the HS_ON signal, shown as HS_ONz. The inverter circuit 404 includes a transistor Q8, a transistor Q9, a transistor Q10, a current mirror 412, a variable resistor R_VAR, a transistor Q11, a resistor R2, and a capacitor C1. For example, the transistors Q8 and Q9 are PFETs, and the transistors Q10 and Q11 are NFETs. Other types of transistors can be used in other examples. The output 410 is coupled to the first control input (e.g., source) of Q1 through the boot capacitor C_BOOT.

A first current terminal (e.g., source) of the transistor Q8 is coupled to an input power terminal 414 (e.g., at voltage VIN). A second current terminal (e.g., drain) of the transistor Q8 is coupled to a first current terminal (e.g., source) of the transistor Q9. A control terminal (e.g., gate) of the transistor Q8 is coupled to an output of an inverter (not shown), which is configured to provide an inverted version of the high-side enable HS_ON signal, shown at HS_ONz. A second current terminal (e.g., drain) of the transistor Q9 is coupled to a first current terminal (e.g., drain) of the transistor Q10, which is also coupled to a bottom plate of capacitor C_BOOT. A control terminal (e.g., gate) of the transistor Q9 is coupled to the current mirror 412. A second current terminal (e.g., source) of the transistor Q10 is coupled to a ground terminal 108. A control terminal (e.g., gate) of the transistor Q10 is coupled to the control terminal of the transistor Q8.

The current mirror 412 includes a transistor Q12 and a transistor Q13. In an example, the transistors Q12 and Q13 are PFETs. The transistors Q12 and Q13 may be implement as other types of transistors in other examples. A first current terminal (e.g., source) of the transistor Q12 is coupled to the input voltage terminal 414. The input voltage terminal 414 is coupled to the control terminal of Q1 through a resistor R3. A second current terminal (e.g., drain) of the transistor Q13 is coupled to the control terminal of the transistor Q9. A control terminal (e.g., gate) of the transistor Q12 is coupled to the control terminal (e.g., gate) of the transistor Q13. A first current terminal (e.g., source) of the transistor Q12 is coupled to the input power terminal 414. A second current terminal (e.g., drain) of the transistor Q12 is coupled to the control terminal of the transistor Q12. The capacitor C1 is coupled between the control terminal of the transistor Q12 and the input power terminal 414. The resistor R_VAR (e.g., a variable impedance network) is coupled between the second current terminal of the transistor Q13 (e.g., a bias terminal) and the ground terminal 108. The resistor R_VAR also includes a control input coupled to an output of high-side slew control logic 420. As described herein, the high-side slew control logic 420 is configured to provide a slew control signal to define a resistance of resistor R_VAR, which is configured to control (e.g., adjust) a slew rate of the high-side drive signal HS_DRIVE from one switching cycle to another. For example, the high-side slew control logic 420 is configured to adjust the slew rate each switching cycle in a sequence of defined slew rates or randomly change the slew rate from one cycle to another. Thus, the impedance of the resistor R_VAR can be modulated responsive to the slew control signal to define a corresponding slew-rate-modulated drive signal at the drive output.

The transistor Q8 is configured to switch current from the input power terminal 414 (e.g., at voltage VIN) to the transistor Q9. The transistor Q11 is configured to control current flow through the current mirror 412. A first current terminal (e.g., drain) of the transistor Q11 is coupled to the second current terminal of the transistor Q12 through the resistor R2. A second current terminal (e.g., drain) of the transistor Q11 is coupled to the ground terminal 108. A control terminal (e.g., gate) of the transistor Q11 is coupled to the input 406 to receive an enable signal, shown as logic signal HS_ON. When the high-side transistor QHS is being turned on, the transistor Q11 and the transistor Q8 are turned on, which causes current flow through the transistors Q12 and Q13 of the current mirror 412. Current flow through the transistor Q13 charges the control terminal of the transistor Q9 at a rate determined by the resistance of resistor R_VAR and the capacitance at the control terminal of the transistor Q9. When the input voltage at 414 falls, responsive to the high-side transistor QHS turning on, the voltage at the control terminal of the transistor Q13 falls (e.g., through discharging of the capacitor C1), and the voltage at the control terminal of the transistor Q9 rises to control the slew rate of the gate drive signal HS_DRIVE for turning on of the high-side transistor QHS.

In the example of FIG. 4, a filter 424 is coupled between the input voltage terminal 414 and the control terminal of the transistor Q1. The filter 424 includes the resistor R3 and a capacitor C2. The resistor R3 is coupled between the input voltage terminal 414 and the control terminal of the transistor Q1. The capacitor C2 is coupled between the control terminal of the transistor Q1 and the ground terminal 108. The filter 424 is thus configured as a low pass filter to low-pass filter the power supply voltage VIN at 414 and provide a more stable input voltage at the control terminal of the transistor Q1 and to the first current terminal of the transistor Q13.

As described herein, the impedance (e.g., resistance) of the resistor R_VAR may be adjusted (e.g., modulated) from one switching cycle to another to change the turn-on rate of the transistor Q9, which determines the turn-on time of the gate pull-up transistor Q1 to further modulate the slew rate of the gate drive signal HS_DRIVE based on the slew control signal, which the feedback path includes a variable impedance network coupled between a bias control terminal and a ground terminal, the variable impedance network has an impedance control input coupled to the slew control output, and an impedance of the variable impedance network is modulated responsive to the slew control signal to define a corresponding modulated slew rate for a drive signal at the drive output. The changes in the impedance of the resistor R_VAR can depend on the configuration of the variable resistor R_VAR, which can be configured depending on the frequency of the converter circuit and EMI requirements. The low-side driver 126 can be configured in the same or similar manner to the high-side driver to modulate the slew rate of the low-side drive signal provided to the control input of the low-side transistor QLS. Alternatively, the slew rate modulating feature may be omitted from the low-side driver in the converter circuit 400.

Figure 5:
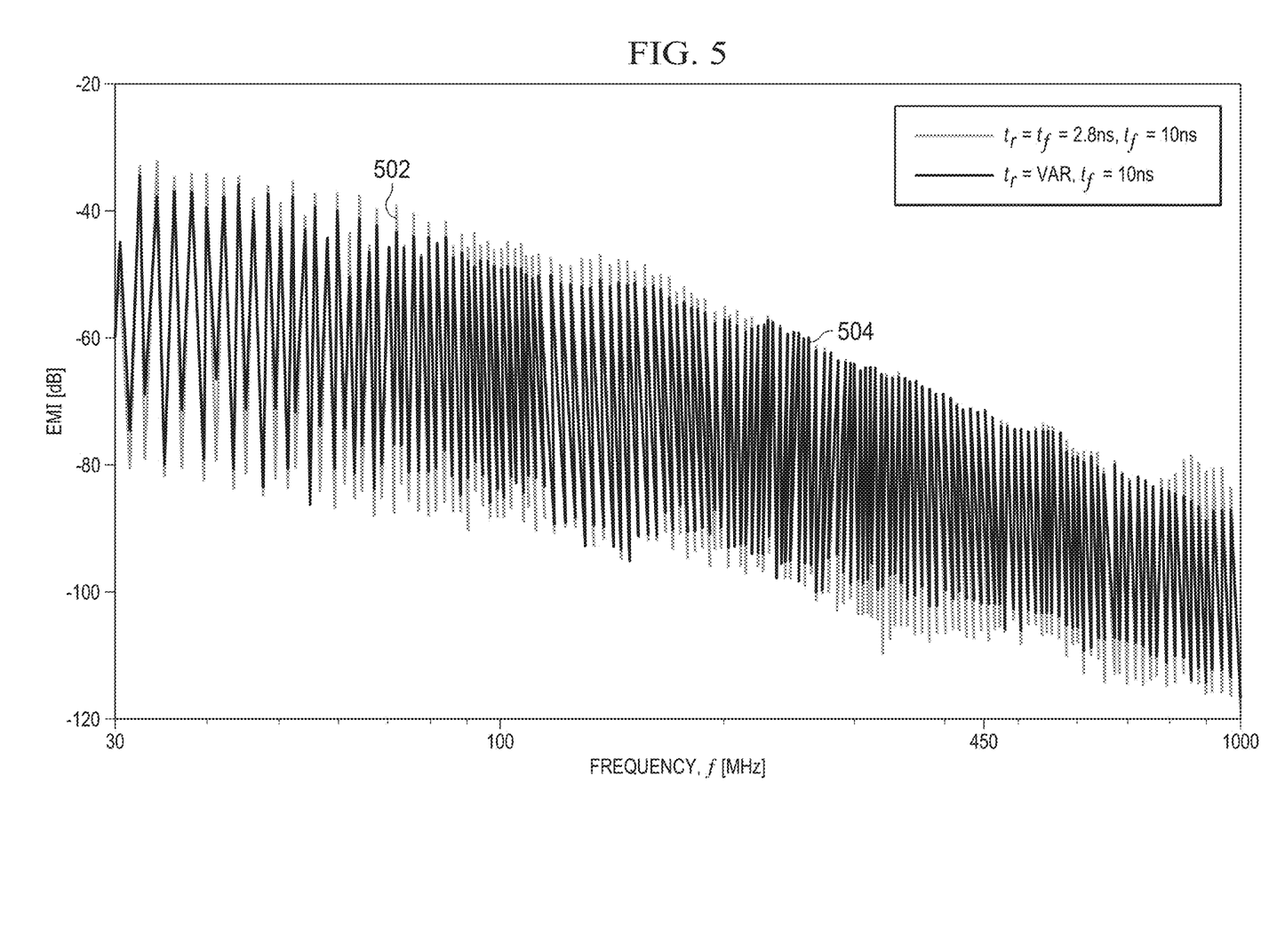
FIGS. 5 and 6 are plots of EMI as a function of frequency showing an example comparison between fixed and variable slew rate drive signals for different operating conditions.
Figure 6:
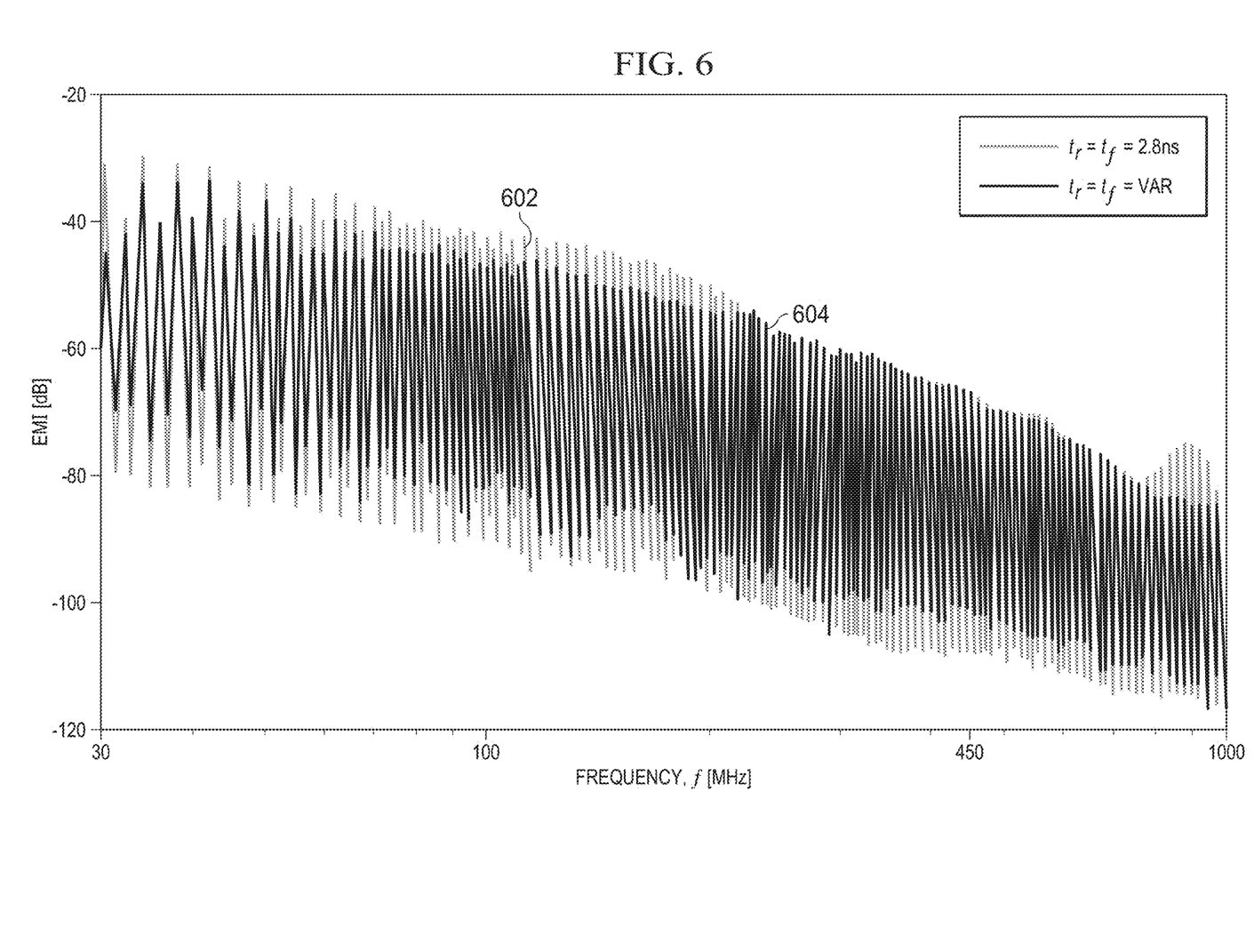

FIGS. 5 and 6 are plots showing EMI for a power converter circuit (e.g., any of the circuits 100, 200, 300 or 400) as a function of frequency. Each of FIGS. 5 and 6 shows a comparison between fixed and variable slew rate drive signals for different operating conditions.

FIG. 5 provides a comparative example of plots 502 and 504 demonstrating EMI in dB over a range of frequencies from 30 MHz to 1000 MHz. The plot 502 is a reference curve representing the absence of modulating slew rate (e.g., having a fixed slew rate), in which the rise time is about 2.8 ns and the fall time is about 10 ns. The plot 504 demonstrates EMI over the same frequency range for a circuit implementing slew rate modulation, such as described herein (see, e.g., FIGS. 1-4). For the plot 504, the slew rate of the high-side drive signal (e.g., HS_DRIVE) had a rise time selected in a sequence for each switching cycle from eight different rise time values ranging from 1 ns to 8 ns (e.g., 1 ns, 1.35 ns, 1.81 ns, 2.44 ns, 3.28 ns, 4.42 ns, 5.4 ns and 8 ns). For sake of simplicity and to focus on one edge (e.g., the rising edge), the fall time was fixed at 10 ns. In other examples, as described herein, either or both the rise and fall times can be modulated. The example of FIG. 5 shows a significant reduction in EMI (e.g., up to about a 7 dB improvement), particularly for higher frequencies from about 700 MHz to about 1000 MHz, when slew rate is modulated as described herein.

FIG. 6 provides another comparative example of plots 602 and 604 demonstrating EMI in dB over a range of frequencies from 30 MHz to 1000 MHz. The plot 602 is a reference curve representing the absence of modulating slew rate of the high-side drive signal (e.g., having a fixed slew rate), in which both the rise and fall times of the high-side drive signal are about 2.8 ns. The plot 604 demonstrates EMI over the same frequency range when the circuit implements slew rate modulation, as described herein. For the plot 604, the circuit modulated the both rise time and fall time in a sequence for each switching cycle from eight different rise time values ranging from 1 ns to 8 ns (e.g., 1 ns, 1.35 ns, 1.81 ns, 2.44 ns, 3.28 ns, 4.42 ns, 5.4 ns and 8 ns). Similar to FIG. 5, the example of FIG. 6 shows a significant reduction in EMI (e.g., up to about a 10 dB improvement), particularly for higher frequencies from about 700 MHz to about 1000 MHz, when slew rate is modulated as described herein.

In this description, numerical designations "first", "second", etc. are not necessarily consistent with same designations in the claims herein.

Additionally, the term "couple" may cover connections, communications, or signal paths that enable a functional relationship consistent with this description. For example, if device A generates a signal to control device B to perform an action, then: (a) in a first example, device A is directly coupled to device B; or (b) in a second example, device A is indirectly coupled to device B through intervening component C if intervening component C does not alter the functional relationship between device A and device B, so device B is controlled by device A via the control signal generated by device A.

Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device described herein as including certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor wafer and/or integrated circuit (IC) package) and may be configured to couple to at least some of the passive elements and/or the sources to form the described structure, either at a time of manufacture or after a time of manufacture, such as by an end user and/or a third party.

Modifications are possible in the described embodiments, and other embodiments are possible, within the scope of the claims.

What is claimed is:

1. A circuit comprising:
   a high-side driver having a high-side slew control input, a high-side drive input and a high-side drive output;
   a low-side driver having a low-side slew control input, a low-side drive input and a low-side drive output; and
   drive control circuitry having a high-side drive control output, a low-side drive control output, and a slew control output, in which the high-side drive control output is coupled to the high-side drive input, the low-side drive control output is coupled to the low-side drive input, the slew control output is coupled to at least one of the high-side slew control input and the low-side slew control input, the drive control circuitry is configured to provide a slew control signal at the slew control output, and at least one of the high-side and low-side drivers is configured to modulate a slew rate of a drive signal at a respective drive output thereof based on the slew control signal, wherein:
   the drive control circuitry includes a plurality of high-side slew control outputs, and the high-side driver includes an inverter circuit having a plurality of drive paths, each having a different respective drive strength, in which each drive path has a path input and a path output, each path input is coupled to a respective high-side slew control output, and each path output is coupled to the high-side drive output.

2. The circuit of claim 1, wherein the at least one of the high-side and low-side drivers is configured to modulate the slew rate of the drive signal at the respective drive output thereof over a number of switching cycles.

3. The circuit of claim 2, wherein the at least one of the high-side and low-side drivers is configured to modulate the slew rate of the drive signal through a sequence of different slew rates or randomly over the number of switching cycles.

4. The circuit of claim 1, wherein:
the high-side driver is configured to provide a high-side drive signal at the high-side drive output having a respective slew rate that is modulated based on the slew control signal; and
the low-side driver is configured to provide a low-side drive signal at the low-side drive output having a respective slew rate based on the slew control signal.

5. The circuit of claim 1, wherein the drive control circuitry includes slew control logic configured to control which one of the plurality of drive paths is operative to provide the drive signal for a respective switching cycle.

6. The circuit of claim 1, wherein the at least one of the high-side and the low-side drivers includes a loop control feedback path coupled between a feedback input and the high-side drive output, in which the loop control feedback path includes a variable impedance network coupled between a bias control terminal and a ground terminal, the variable impedance network has an impedance control input coupled to the slew control output, and an impedance of the variable impedance network is modulated responsive to the slew control signal to define a corresponding modulated slew rate for a drive signal at the respective drive output.

7. The circuit of claim 6, wherein:
the drive control circuitry includes a plurality of slew control outputs, and
the variable impedance network comprises a network of capacitors and switches coupled in parallel between the bias control terminal and the ground terminal, in which each of the switches has a switch control input coupled to a respective one of the slew control outputs.

8. The circuit of claim 1, further comprising:
a high-side transistor having a first current terminal, a second current terminal, and a high-side control terminal, in which the high-side control terminal is coupled to the high-side drive output, and the first current terminal is coupled to an input voltage terminal;
a low-side transistor having a third current terminal, a fourth current terminal, and a low-side control terminal, in which the low-side control terminal is coupled to the low-side drive output, the third current terminal is coupled to the second current terminal, and the fourth current terminal is coupled to a ground terminal.

9. The circuit of claim 1, wherein the drive control circuitry is configured to provide high-side and low-side logic signals at the high-side drive control output and the low-side drive control output, respectively, in which each of the high-side and low-side logic signals has a switching cycle length that is one of fixed or variable, and the slew rate of the drive signal changes from one cycle to another based on the slew control signal.

10. The circuit of claim 9, wherein the high-side driver is configured to modulate the slew rate of the high-side drive signal through a sequence of different slew rates or randomly over a number of switching cycles based on the slew control signal.

11. The circuit of claim 1 implemented as an integrated circuit, in which the high-side driver, the low-side driver and the drive control circuitry reside on a common substrate.

12. A circuit comprising:
a high-side driver configured to provide a high-side drive signal based on a high-side logic signal, in which the high-side drive signal has a slew rate that is modulated based on a high-side slew control signal;
drive control circuitry configured to provide the high-side logic signal; and
slew control logic configured to provide the high-side slew control signal,
wherein:
the high-side driver includes a feedback path having a variable impedance network, and the variable impedance network has an impedance that is modulated responsive to the high-side slew control signal.

13. The circuit of claim 12, further comprising a low-side driver configured to provide a low-side drive signal based on a low-side logic signal provided by the drive control circuitry, wherein:
the slew control logic includes high-side slew control logic and low-side slew control logic, in which the high-side slew control logic is configured to provide the high-side slew control signal and the low-side slew control logic is configured to provide a low-side slew control signal, and
the low-side driver is configured to modulate a slew rate of the low-side drive signal responsive to the low-side slew control signal.

14. The circuit of claim 12, wherein the high-side driver is configured to modulate the slew rate of the high-side drive signal over a number of switching cycles responsive to the high-side slew control signal provided for the number of switching cycles.

15. The circuit of claim 14, wherein the high-side driver is configured to modulate the slew rate of the high-side drive signal through a sequence of different slew rates or randomly over the number of switching cycles.

16. The circuit of claim 12, wherein the high-side logic signal has a switching cycle length that is one of fixed or variable, and the slew rate of the high-side drive signal changes from one cycle to another responsive to the high-side slew control signal.

17. The circuit of claim 12, further comprising:
a low-side driver configured to provide a low-side drive signal based on a low-side logic signal provided by the drive control circuitry; and
a bridge circuit comprising:
a high-side transistor; and
a low-side transistor, in which the bridge circuit is configured to provide a switching voltage at a switching terminal thereof responsive to the high-side and low-side drive signals.

18. The circuit of claim 12 implemented as an integrated circuit, in which the high-side driver, the slew control logic and the drive control circuitry reside on a common substrate.

19. A system comprising:
a bridge circuit comprising:
a high-side transistor having a first current terminal, a second current terminal, and a high-side control terminal, in which the first current terminal is coupled to an input voltage terminal; and a low-side transistor having a third current terminal, a fourth current terminal, and a low-side control terminal, in which the third current terminal is coupled to the second current terminal, and the fourth current terminal is coupled to a ground terminal;

a high-side driver having a high-side slew control input, a high-side drive input and a high-side drive output, in which the high-side drive output is coupled to the high-side control terminal;

a low-side driver having a low-side slew control input, a low-side drive input and a low-side drive output, in which the low-side drive output is coupled to the low-side control terminal; and drive control circuitry having a high-side drive control output, a low-side drive control output, a low-side slew control output, and a high-side slew control output, in which the high-side drive control output is coupled to the high-side drive input, the low-side drive control output is coupled to the low-side drive input, the low-side slew control output is coupled to the low-side slew control input, the high-side slew control output is coupled to the high-side slew control input, and at least one of the high-side and low-side drivers is configured to modulate a slew rate of a drive signal at a respective drive output thereof based on a slew control signal, wherein:

the slew rate is modulated by changing respective slew rates of respective switching cycles to generate an average slew rate; and the respective slew rates are selected based on a switching frequency of the system, an operating frequency of a device coupled to the system, and a level of electromagnetic interference.

20. The system of claim 19, further comprising:

high-side slew control logic configured to provide a high-side slew control signal; and low-side slew control logic configured to provide a low-side slew control signal, wherein:

the drive control circuitry is configured to provide a low-side logic signal at the low-side drive control output and a high-side logic signal at the high-side drive control output;

the high-side driver is configured to provide a high-side drive signal based the high-side logic signal, in which the high-side drive signal has a slew rate that is modulated based on the high-side slew control signal; and the low-side driver is configured to provide a low-side drive signal based the low-side logic signal, in which the low-side drive signal has a slew rate that is modulated based on the low-side slew control signal.

21. The circuit of claim 20, wherein the drive control circuitry is configured to provide high-side and low-side logic signals at the high-side drive control output and the low-side drive control output, respectively, in which the high-side and low-side logic signals have a switching cycle length that is one of fixed or variable, and the slew rate of the drive signal changes from one cycle to another responsive to the slew control signal.

22. The circuit of claim 21, wherein the high-side driver is configured to modulate the slew rate of the high-side drive signal through a sequence of different slew rates or randomly over a number of switching cycles.

\* \* \* \* \*